United States Patent [19]
Azotea

[11] Patent Number: 5,640,300
[45] Date of Patent: Jun. 17, 1997

[54] INTERRUPTER CIRCUIT WITH MCTS AND PULSE RESONANT COMMUTATION FOR RAPIDLY SWITCHING OFF KILO-AMP AC LOAD CURRENTS

[75] Inventor: James K. Azotea, Saratoga Springs, N.Y.

[73] Assignee: Harris Corporation, Melbourne, Fla.

[21] Appl. No.: 521,813

[22] Filed: Aug. 31, 1995

[51] Int. Cl.$^6$ ................................................ H02H 3/18
[52] U.S. Cl. ........................... 361/87; 361/100; 361/115
[58] Field of Search ............................ 361/87, 100, 115, 361/93, 2, 18, 3; 327/374, 428, 450, 461

[56] References Cited

U.S. PATENT DOCUMENTS

| 3,890,561 | 6/1975 | Demarest | 323/24 |
|---|---|---|---|
| 3,959,668 | 5/1976 | Ohhinata | 307/252 G |
| 5,164,872 | 11/1992 | Howell | 361/3 |
| 5,463,344 | 10/1995 | Temple | 327/374 |

Primary Examiner—Jeffrey A. Gaffin
Assistant Examiner—Stephen Jackson
Attorney, Agent, or Firm—Rogers & Killeen

[57] ABSTRACT

A circuit and method for interrupting an AC load current includes a first MOS Controlled Thyristor (MCT) for selectively interrupting the load current. The current through the first MCT is reduced when the load current is to be interrupted by providing a pulse resonant commutation (PRC) current through the first MCT which flows in a direction opposed to the AC load current direction and which has a magnitude reducing the current through the first MCT to an MCT "off" condition (e.g., when a voltage across the MCT is reversed, when there is near zero current through the MCT, or when a current is within the MCT's SOA.) The first MCT turns itself off when MCT gate voltage is an "on" voltage and when reverse voltage is across the MCT. An MCT "off" voltage may then be provided by sensing MCT current and providing an "off" voltage to the MCT gate when the sensed current indicates that the MCT is an "off" condition. The PRC current is generated by a second MCT which is triggered with a brief gate pulse when the load current is to be interrupted. The load current also may be sensed and the gate pulse triggered in the second MCT to interrupt the load current when the load current exceeds a predetermined value.

20 Claims, 6 Drawing Sheets

INTERRUPTER CIRCUIT WITH MCTS AND PULSE RESONANT COMMUTATION FOR RAPIDLY SWITCHING OFF KILO-AMP AC LOAD CURRENTS

BACKGROUND OF THE INVENTION

This application is related to application Ser. No. 08/389,313 filed Feb. 16, 1995 by the inventor hereof that is entitled "Computer Controlled AC Circuit Breaker", that is assigned to the assignee hereof, and which is incorporated into this application by reference.

The present invention is directed generally to circuit interrupters such as switches, circuit breakers and the like for turning off an AC current, and more particularly to a circuit for interrupting a high power AC load current that has fewer components and a higher load current interrupt capability than known circuits.

Computer controlled circuit interrupters control power distribution with computers and provide various advantages over mechanical devices. For example, the over current protection is fast, energy (watt-seconds) in the circuit may be limited, operation at high temperature does not affect load current trip point, the load current is tracked accurately, and switching speed is not a function of load current. Computer controlled circuit interrupters are discussed further in the above-referenced application.

High power circuit interrupters may be needed to turn off hundreds or thousands of amperes of AC load current, and are desirably computer controlled in many applications. High power circuit interrupters of the prior art are either too slow for operation in a computer controlled circuits, are not adaptable to a solid state single integrated circuit embodiment which is desirable for computer controlled circuits, or require many components (increasing cost and complexity) to achieve modest results. For example, to turn off 500 A at 200 V with the switch discussed in the above referenced application, the switch would require eight MOS Controlled Thyristors (MCTs)—four 120 A MCTs for each polarity. In contrast, the circuit disclosed herein uses only four MCTs to turn off a 1000 A load current.

Accordingly, it is an object of the present invention to provide a novel circuit and method for interrupting an AC load current which is adaptable to computer control and obviates the problems of the prior art.

It is another object of the present invention to provide a novel circuit and method for interrupting an AC load current in which a MOS Controlled Thyristor (MCT) selectively controls transmission of the load current.

It is yet another object of the present invention to provide a novel circuit and method for interrupting an AC load current in which a pulse resonant commutation (PRC) current decreases the current through a load current controlling MCT so that even large load currents may be turned off with a single MCT.

It is still another object of the present invention to provide a novel circuit and method for interrupting an AC load current in which a PRC current for decreasing the current in a load current controlling MCT is provided from a second MCT that is turned on when the load current is to be interrupted.

It is a further object of the present invention to provide a novel circuit and method for interrupting an AC load current in which a brief PRC current for decreasing the current in a load current controlling first MCT is provided from a second MCT in a PRC circuit that is turned on when the load current is to be interrupted, and in which the load current is initially provided through a switching device in parallel with the first MCT when the first MCT is turned off, and then through the second MCT.

It is yet a further object of the present invention to provide a novel circuit and method for interrupting an AC load current in which PRC currents are provided to each of two serially connected MCTs for turning off the load current by decreasing the current through the two MCTs to an MCT "off" condition so that they may be turned off.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
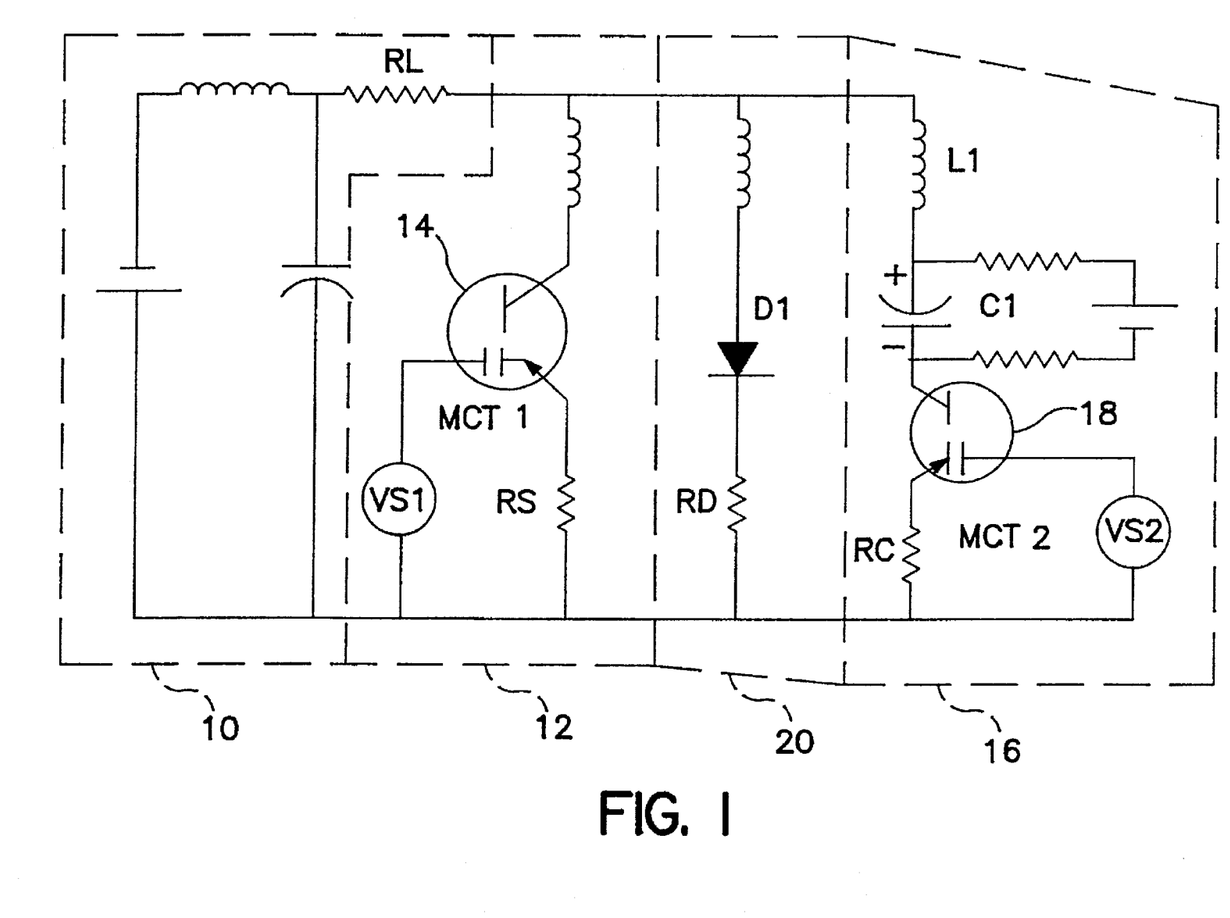
FIG. 1 is a circuit diagram of an embodiment of the present invention.

With reference now to FIG. 1, an embodiment of the present invention may include a source 10 of an AC load current, a first circuit component 12 for selectively interrupting the AC load current with a first MOS Controlled Thyristor (MCT1) 14, and a second circuit component 16 connected in parallel with first component 12 for providing a pulse resonant commutation (PRC) current to first MCT 14 in a direction opposite to the direction of the AC load current through first MCT 14 and with a magnitude that will reduce the current through first MCT 14 to an MCT "off" condition when the AC load current is to be interrupted. An MCT "off" condition may be defined in several ways, such as when the voltage across the MCT is reversed, when near zero current is passing through the MCT, or when a current through the MCT is within the MCT's safe operating area (SOA). Second component 16 may include a second MCT 18 to provide the PRC current. A one direction switching device 20 may also be provided in parallel with first component 12.

Figure 2:
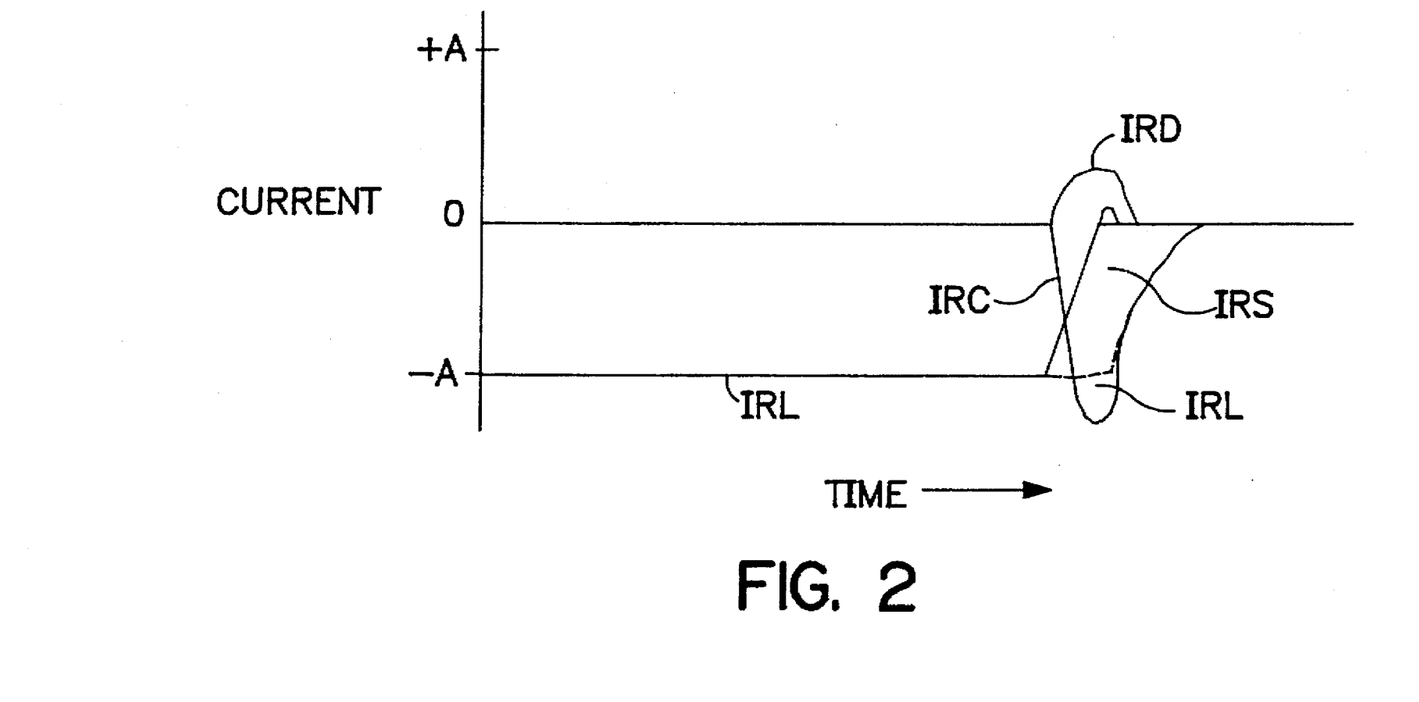
FIG. 2 is a graph illustrating the changes in the currents through components in the embodiment of FIG. 1.

By way of explanation, and with reference to FIGS. 1 and 2, the interruption of a load current $I_{RL}$ flowing though first MCT 14 and resistor RS is initiated when a gate pulse (e.g., from VS2) is provided to second MCT 18. Second MCT 18 generates a PRC current $I_{RC}$ that flows through first MCT 14 in a direction opposite to load current $I_{RL}$ and with a magnitude sufficient to drive the current through first MCT 14 to an MCT "off" condition. The action of the PRC current forces first MCT 14 current to an "off" condition so the MCT can be turned off before the peak of the PRC current. A small portion $I_{RD}$ of PRC current $I_{RC}$ flows through switching device 20. At this point, first MCT 14 turns itself off when its gate voltage drops to an MCT "off" voltage (e.g., −7 volts). The "off" gate voltage may be provided to the gate of first MCT 14 by VS1 when a sensor, such as resistor RS, indicates that first MCT 14 is in an "off" condition. When first MCT 14 is turned off load current $I_{RL}$ flows through switching device 20, as indicated by the horizontal portion of dashed line $I_{RL}$, since there is stored charge in switching device 20 (e.g., in diode D1) from PRC current $I_{RC}$. Switching device 20 opens after the charge is cleared (as indicated by $I_{RD}$ returning to zero) and load current $I_{RL}$ is then carried by second component 16 and falls to zero (thereby completing the interruption of the load current) at the same time and rate as PRC current $I_{RC}$ falls to zero. As will be appreciated by those of skill in the art, first MCT 14 desirably has a smaller forward drop and a lower equivalent series resistance than switching device 20 to prevent switching device 20 from pulling the PRC current from first component 12.

By way of further explanation, it has been found that the difference between the peak PRC current and the load current through the MCT (in other words the net current through the MCT being turned off determines how much time is available to turn off the MCT, with the peak PRC current being a higher amperage than the load current. The greater the difference between the peak PRC current and the load current, the longer the time available to turn off the MCT. As is known, MCT's require a finite amount of time to turn off, and the components herein should be selected to provide a current difference which is large enough to provide the required turn off time. Desirably, the MCT "off" time is about two-thirds of the PRC "on" time. The length of the gate pulse to MCT2 may be set to approximately 2/3 pi times the square root of L1 times C1. The peak PRC current may be approximately equal to the rectified AC line voltage divided by the characteristic impedance of the resonant circuit (the square root of L1 divided by C1). The approximate maximum turn off capability may be considered to be about 20% less than the peak PRC current and about 20% less than the maximum MCT surge current rating.

Figure 3:
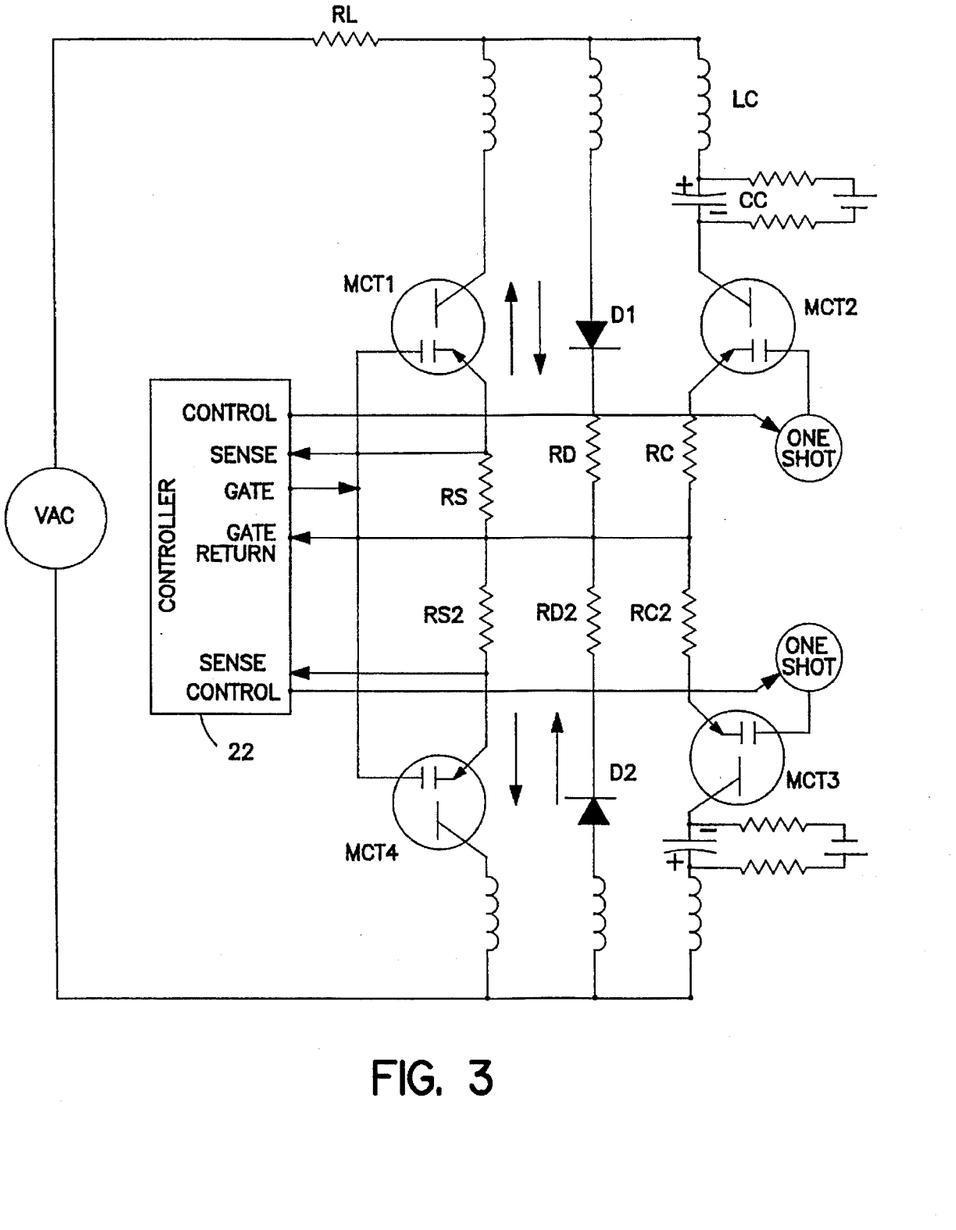
FIG. 3 is a circuit diagram of a further embodiment of the present invention.

FIG. 3 illustrates a further embodiment in which two of the circuit of FIG. 1 are combined (one is a mirror image of the other) to provide a complete bilateral switch. If the interrupter is to be computer controlled a controller 22 may be included for providing instructions to interrupt the load current. The operation of the circuit of FIG. 3 will be explained below in relation to two modes of operation, a single PRC mode (SPRC) and a double PRC mode (DPRC), each of which has unique advantages. For example, as will be apparent from the following discussion, the SPRC mode of operation provides less high frequency noise in the load current during turn off than the DPRC mode, while the DPRC mode requires fewer components. The circuit may designed for operation in both modes and the mode of operation may be selected, or the circuit may be designed to provide only one mode of operation.

Figure 4:
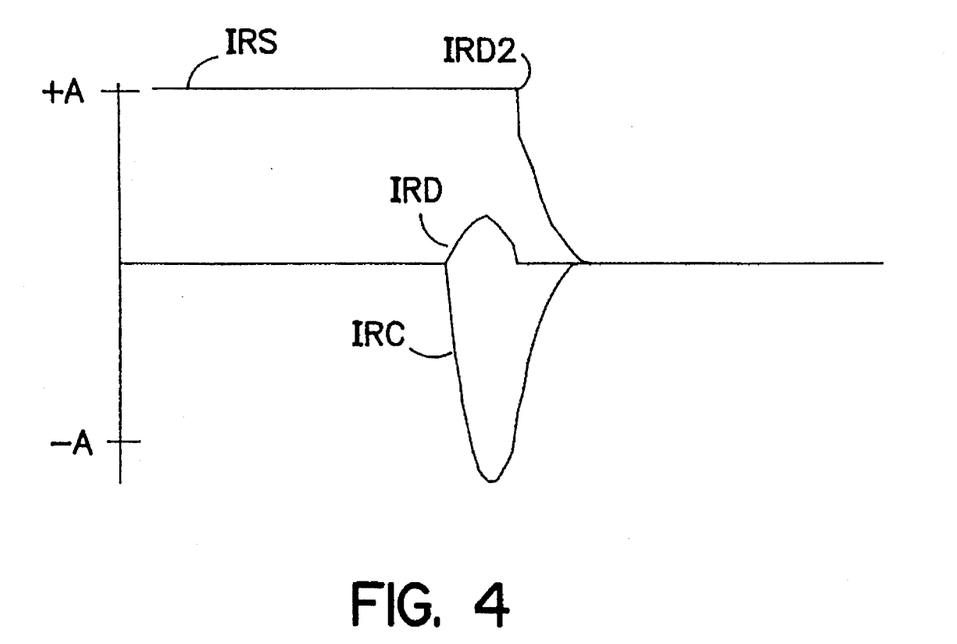
FIG. 4 is a graph illustrating the changes in the currents through components in the embodiment of FIG. 3 in the single PRC mode of operation.

The SPRC mode of operation is similar to that discussed above in relation to the circuit of FIG. 1 (which also provided a single PRC current) for a full bilateral device. With reference to FIGS. 3 and 4, a PRC current is generated from MCT2 to force the current through MCT1 to an MCT "off" condition where it may be turned off safely and easily. In a preferred embodiment the "off" condition of MCT1 is sensed when the current through diode D1 is indicated to be opposite the current through MCT1 by resistor RS and at a predetermined magnitude, such as about 100 to 300 amps for a system in which A in FIG. 4 is about 800 amps (the same holds for D2, MCT4 and RS2). As MCT1 is being turned off, PRC current flows through D1 which allows load current to flow through RL and D1. As the current through D1 falls to zero a small amount of reverse recovery current oscillates about zero until D1 opens and the load current falls to zero. The rate at which the load current falls to zero is a function of the peak PRC current and frequency. The magnitude of oscillation in reverse recovery is determined by the rate of change of the current through the MCT, the reverse recovery time of the diodes, and peak curent. Oscillations may be controlled by using saturable reactors or RC snubbers.

The two sense resistors RS and RS2 may detect the polarity of the load current and provide a voltage proportional to the sensed load current to controller 22. The voltage may be compared to a reference voltage to determine whether a trip point has been reached. When the trip point has been exceeded, controller 22 may generate a control signal for providing a "one shot" gate pulse signal to MCT2 to generate the PRC current.

Figure 5:
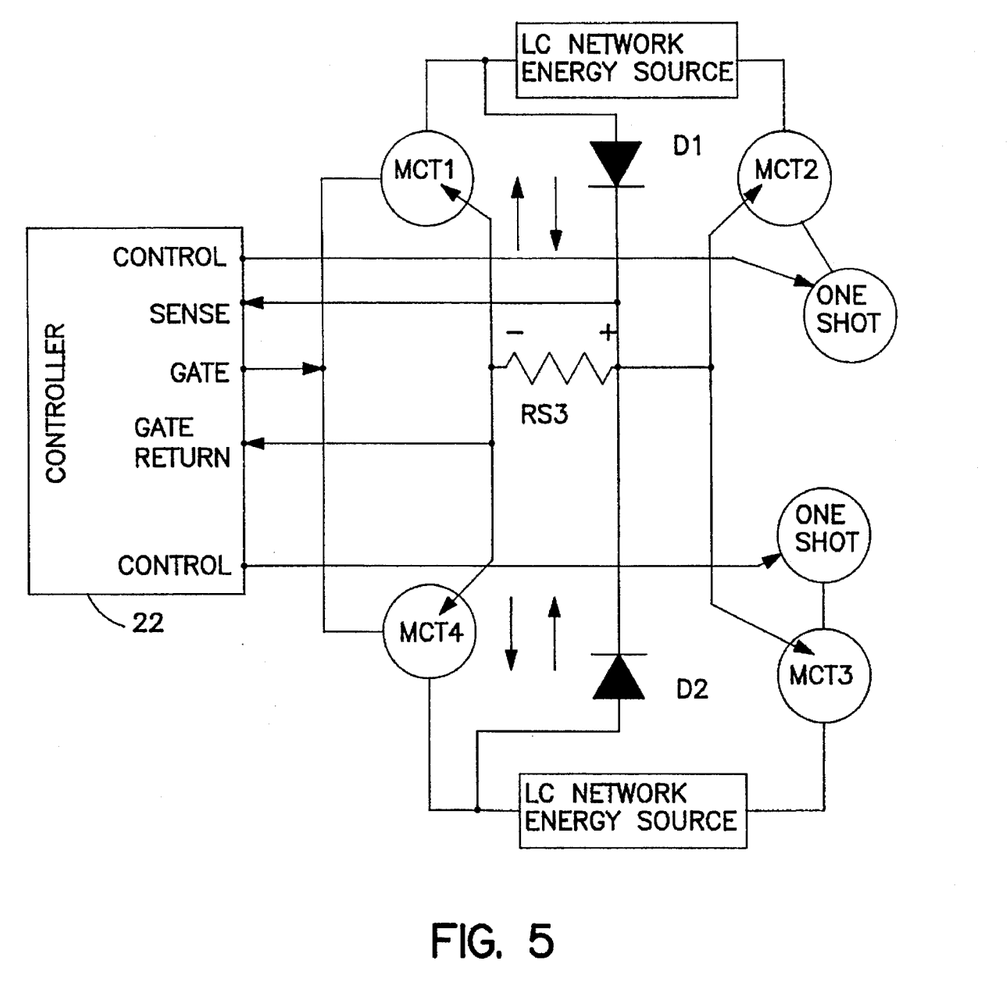
FIG. 5 is a partial circuit and block diagram of a portion of a further embodiment of the present invention.
Figure 6:
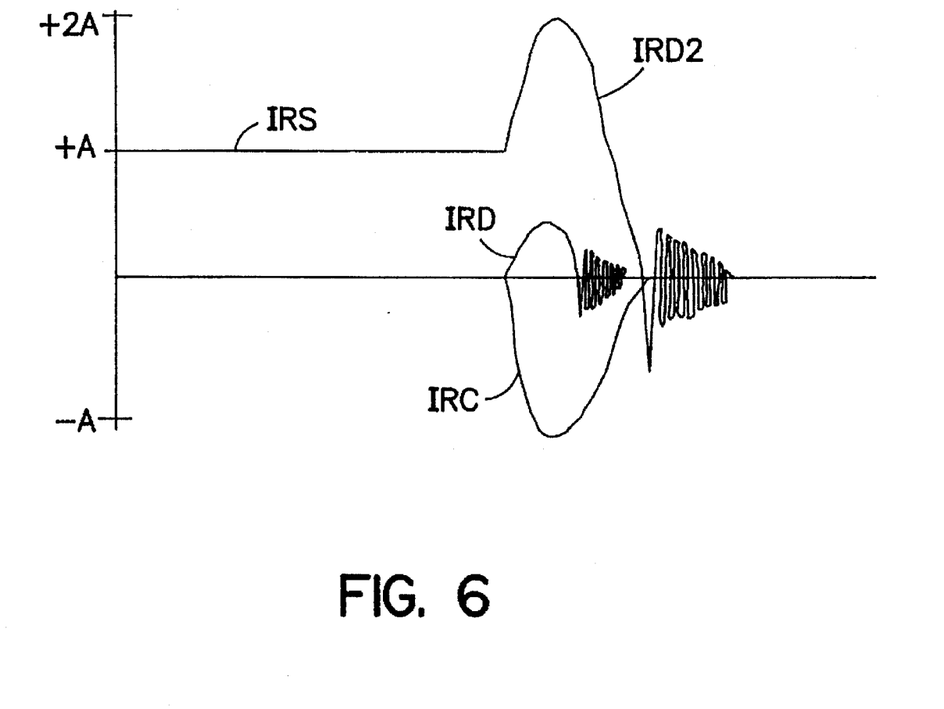
FIG. 6 is a graph illustrating the changes in the currents through components in the embodiment of FIG. 5 in the double PRC mode of operation.

The DPRC mode of operation may be understood with reference to FIGS. 5 and 6. FIG. 5 depicts controller 22 and the portion of the circuit of FIG. 3 that facilitates an understanding of this mode of operation, as modified for DPRC operation. Operation begins with a current flowing through RL, MCT1 and D2. A single sense resistor RS3 connected from between the terminals of MCT1 and MCT4 to between diodes D1 and D2 detects the absolute value of the AC load current which may be compared to a variable DC trip level ("trip" in controller 22). When "trip" is exceeded controller 22 generates signals for providing simultaneous gate pulses to MCT2 and MCT3 so that two PRC currents are provided, one for MCT1 and one for MCT4. As is apparent from a comparison of FIGS. 4 and 6, a difference between the SPRC mode and the DPRC mode is that diode D2 must carry both the load current plus the PRC current initiated from MCT3 in the DPRC mode so that the peak diode load can be twice as much. The reverse recovery time of D2 is also increased so that high frequency ringing may be induced in the load current as it is interrupted. The reverse recovery problem may be solved conventionally by the use of saturable reactors, or a RC snubber, although the former is more cost effective and provides better results.

The DPRC mode may use one sense resistor RS3 (instead of two in the SPRC mode) to measure the absolute value of the load current. Although the waveform in the DPRC mode is not as "tame" as the SPRC mode, the DPRC circuitry (if configured for DPRC only) includes fewer parts and a less complicated controller.

For particularly large load currents (e.g., more than 1000 amperes) the two diodes D1 and D2 may be replaced with a MCT which has similar power diode characteristics.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof. For example, the MCTs shown are P-MCTs, although the invention is not so limited.

What is claimed is:

1. A method of interrupting an AC current comprising the steps of:

(a) providing an AC load current through a first MOS Controlled Thyristor (MCT);

(b) providing a pulse resonant commutation (PRC) current through the first MCT which flows in a direction opposed to the AC load current direction and which has a magnitude reducing the current through the first MCT to an MCT "off" condition, the PRC current being generated by the steps of providing a gate pulse to a second MCT connected in parallel with the first MCT when the AC load current is to be interrupted, and providing the PRC current from the second MCT;

(c) sensing the current through the first MCT; and (d) providing a signal to turn the first MCT off when the sensed current through the first MCT is at an MCT "off" condition.

2. The method of claim 1 further comprising the steps of providing a diode in parallel with the first MCT, and providing the AC load current first through the diode and then through the second MCT when the first MCT is turned off.

3. The method of claim 2 further comprising the step of reducing the AC load current in the second MCT to zero at substantially the same time and at the same rate as the PRC current falls to zero in the second MCT.

4. The method of claim 1 further comprising the steps of sensing when the AC load current exceeds a predetermined value and providing the gate pulse to the second MCT when it does.

5. The method of claim 4 further comprising the step of providing a sense resistor connected to a terminal of the first MCT for sensing when the AC current load exceeds the predetermined value.

6. The method of claim 4 further comprising the step of limiting the duration of the gate pulse to a period whose length is proportional to the square root of L times C, where L is the inductance of an inductor and C is the capacitance of a capacitor, both connected in series with the second MCT to form a PRC circuit.

7. The method of claim 6 further comprising the step of setting a peak PRC current equal to a rectified AC line voltage divided by the impedance of the PRC circuit, the square root of L over C.

8. The method of claim 6 further comprising the steps of providing a diode in parallel with the first MCT, providing the AC load current initially through the diode when the first MCT is turned off, and controlling the rate of decrease of oscillations of current in the diode.

9. A method of interrupting an AC current comprising the steps of:

(a) providing an AC load current through first and fourth MOS Controlled Thyristor (MCT) connected in series;

(b) providing a first pulse resonant commutation (PRC) current through the first MCT which flows in a direction opposed to the AC load current direction through the first MCT and which has a magnitude reducing the current through the first MCT to an MCT "off" condition, the first PRC current being generated by the steps of providing a gate pulse to a second MCT connected in parallel with the first MCT when the AC load current is to be interrupted, and providing the first PRC current from the second MCT;

(c) providing a second PRC current through the fourth MCT which flows in a direction opposed to the AC load current direction through the fourth MCT and which has a magnitude reducing the current through the fourth MCT to an MCT "off" condition, the second PRC current being generated by the steps of providing a gate pulse to a third MCT connected in parallel with the fourth MCT when the AC load current is to be interrupted, and providing the second PRC current from the third MCT;

(d) sensing the currents through the first and fourth MCTs; and (e) providing signals to turn the first and fourth MCTs off when the sensed currents through the first and fourth MCTs are at an MCT "off" condition.

10. The method of claim 9 wherein the AC line current exceeds 1000 amps.

11. The method of claim 9 further comprising the steps of sensing when the AC load current exceeds a predetermined value and providing the gate pulses to the second and third MCTs when it does.

12. The method of claim 10 further comprising the steps of providing a pair of serially connected, oppositely directed diodes in parallel with the first and fourth MCTs, and providing a sense resistor connected from between the first and fourth MCTs to between the diodes for sensing when the AC current load exceeds the predetermined value.

13. A circuit for interrupting an AC current comprising:

two circuit components connected in parallel for carrying an AC line current therethrough;

a first of said two components comprising a first MOS Controlled Thyristor (MCT) for selectively interrupting the AC line current;

a second of said two components comprising a first pulse resonant commutation (PRC) circuit with a second MCT for selectively providing a first PRC current to said first MCT in a direction opposite to a direction of the AC line current through said first MCT in order to reduce a current through said first MCT to an MCT "off" condition when the AC line current is to be interrupted;

a controller for providing a gate pulse to said second MCT so as to provide the first PRC current to said first MCT when the AC line current is to be interrupted; and a sensor for sensing the current through the first MCT and for indicating that said first MCT is to be turned off when the sensed current is at an MCT "off" condition.

14. The circuit of claim 13 further comprising a diode connected in parallel with said first MCT, wherein the AC load current is initially provided through said diode and then through said second MCT when said first MCT is turned off.

15. The circuit of claim 13 wherein said first PRC circuit further comprises an inductor with inductance L and a capacitor with capacitance C connected in series with said second MCT, wherein a duration of the gate pulse is limited to a period whose length is proportional to the square root of L times C.

16. The circuit of claim 13 further comprising means for sensing when the AC load current exceeds a predetermined value and providing the gate pulse to said second MCT when it does.

17. The circuit of claim 16 wherein said means for sensing comprises a sense resistor connected to a terminal of said first MCT for sensing when the AC load current exceeds the predetermined value.

18. The circuit of claim 13 wherein said first of two components further comprises a fourth MCT connected in series with said first MCT for selectively interrupting the AC line current;

wherein said second of two components further comprises a second PRC circuit connected in series with said first PRC circuit and having a third MCT for selectively providing a second PRC current to said fourth MCT in a direction opposite to a direction of the AC line current through said fourth MCT in order to reduce a current through said fourth MCT to an MCT "off" condition when the AC line current is to be interrupted;

wherein said controller is further for providing a gate pulse to said third MCT so as to provide the second PRC current to said fourth MCT when the AC line current is to be interrupted; and wherein said sensor is further for sensing the current through the fourth MCT and for indicating that said fourth MCT is to be turned off when the sensed current is at an MCT "off" condition.

19. The circuit of claim 18 further comprising a sensor for sensing when the AC load current exceeds a predetermined value and providing the gate pulses to said second and third MCTs when it does.

20. The circuit of claim 19 further comprising a pair of serially connected, oppositely directed diodes in parallel with said first and fourth MCTs, and a sense resistor connected from between said first and fourth MCTs to between said diodes for sensing when the AC current load exceeds the predetermined value.

* * * * *